United States Patent
Lim et al.

(10) Patent No.: US 11,764,087 B2
(45) Date of Patent: Sep. 19, 2023

(54) PROCESS APPARATUS INCLUDING A NON-CONTACT THERMO-SENSOR

(71) Applicant: SAMSUNG ELECTRONICS CO., LTD., Suwon-si (KR)

(72) Inventors: Chaemook Lim, Yongin-si (KR); Yeongrack Son, Seoul (KR); Ohhyuk Kwon, Suwon-si (KR); Dongouk Kim, Chuncheon-si (KR); Youngbum Kim, Yongin-si (KR); Woohee Kim, Ansan-si (KR); Dongjoon Lee, Suwon-si (KR); Kwanghyeon Jeong, Hwaseong-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 449 days.

(21) Appl. No.: 16/898,965

(22) Filed: Jun. 11, 2020

(65) Prior Publication Data
US 2021/0183672 A1    Jun. 17, 2021

(30) Foreign Application Priority Data

Dec. 13, 2019  (KR) .................. 10-2019-0166604

(51) Int. Cl.
H01L 21/67   (2006.01)
H01L 21/263  (2006.01)
H01L 21/02   (2006.01)

(52) U.S. Cl.
CPC .. H01L 21/67248 (2013.01); H01L 21/02255 (2013.01); H01L 21/2636 (2013.01)

(58) Field of Classification Search
None
See application file for complete search history.

(56) References Cited

U.S. PATENT DOCUMENTS

| 5,841,110 A | 11/1998 | Nenyei et al. |
| 6,016,383 A * | 1/2000 | Gronet ............... F27B 17/0025 |
| | | 392/416 |
| 6,293,696 B1 | 9/2001 | Guardado |
| 6,835,914 B2 | 12/2004 | Timans |

(Continued)

FOREIGN PATENT DOCUMENTS

| JP | 2000-260726 A | 9/2000 |
| JP | 3517400 B2 | 4/2004 |

(Continued)

OTHER PUBLICATIONS

Hwang et al., KR 20090090468, Contactless Temperature Monitoring Device for Thin Film Forming Apparatus, Aug. 26, 2009 (Year: 2009).*

*Primary Examiner* — Alexander G Ghyka
(74) *Attorney, Agent, or Firm* — Sughrue Mion, PLLC

(57) ABSTRACT

A process apparatus includes a heating module and a supporter disposed below the heating module. A process space is provided between the heating module and the supporter. The heating module includes a housing, at least one heating lamp disposed in the housing, at least one temperature sensor disposed in the housing, and a blocking plate disposed under the housing. The blocking plate spatially separates the at least one heating lamp from the process space, and the blocking plate includes at least one window spatially connecting the at least one temperature sensor to the process space.

17 Claims, 13 Drawing Sheets

(56) References Cited

U.S. PATENT DOCUMENTS

| | | |
|---|---|---|
| 8,245,902 B2 | 8/2012 | Lee et al. |
| 8,967,860 B2 | 3/2015 | Patalay |
| 9,470,581 B2 | 10/2016 | Ji |
| 2004/0084437 A1* | 5/2004 | Timans ............. H01L 21/67115 219/390 |
| 2008/0169279 A1* | 7/2008 | Fukuoka ........... H01L 21/67248 118/725 |
| 2015/0181649 A1 | 6/2015 | Ji |

FOREIGN PATENT DOCUMENTS

| | | |
|---|---|---|
| JP | 2008-98214 A | 4/2008 |
| JP | 2008-235858 A | 10/2008 |
| JP | 5077018 B2 | 11/2012 |
| JP | 5346256 B2 | 11/2013 |
| JP | 2015-226068 A | 12/2015 |
| JP | 6153749 B2 | 6/2017 |
| JP | 2018-166204 A | 10/2018 |

* cited by examiner

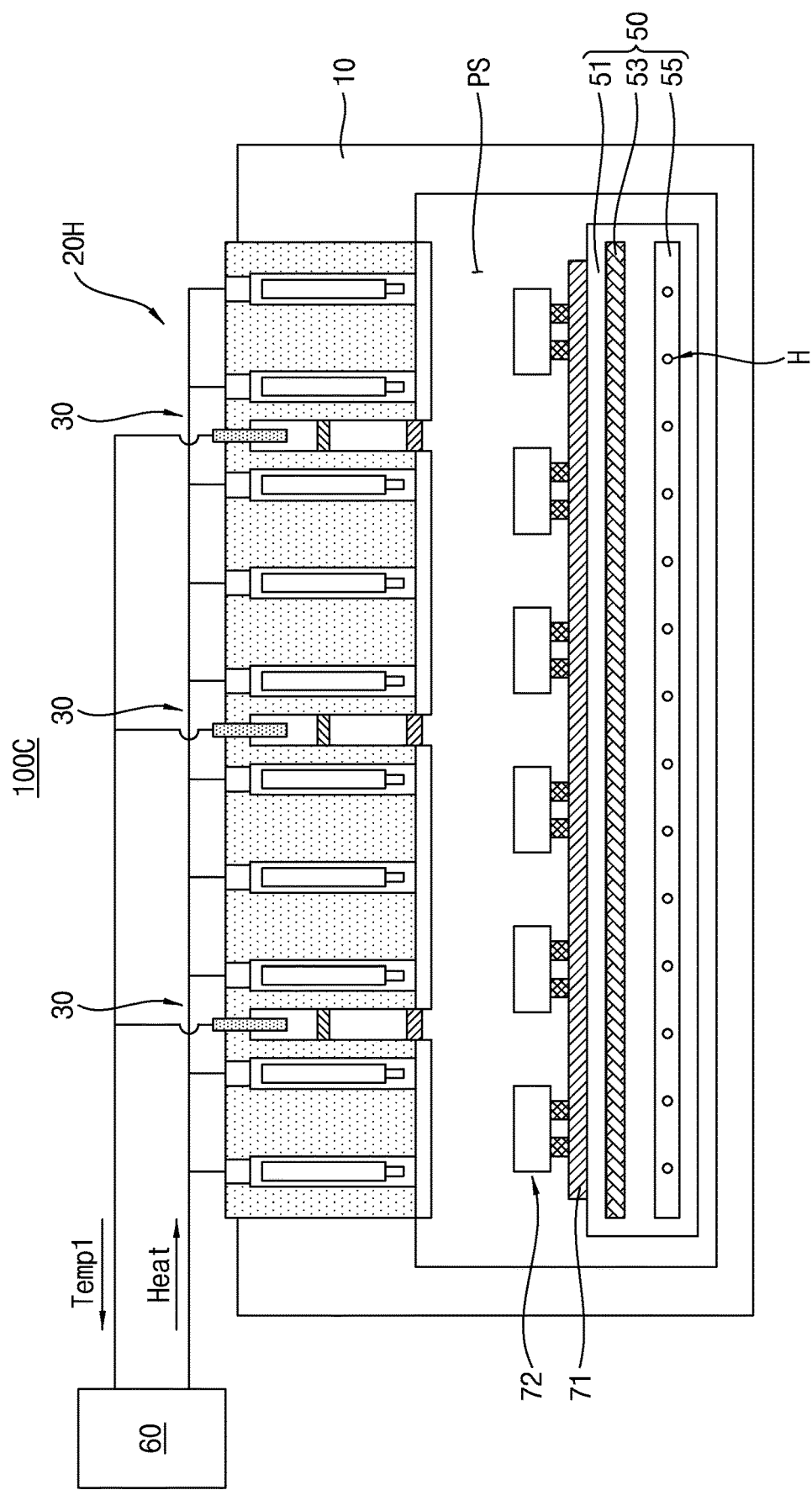

PROCESS APPARATUS INCLUDING A NON-CONTACT THERMO-SENSOR

CROSS-REFERENCE TO THE RELATED APPLICATION

This application is based on and claims priority under 35 U.S.C. § 119 to Korean Patent Application No. 10-2019-0166604, filed on Dec. 13, 2019, in the Korean Intellectual Property Office, the disclosure of which is incorporated herein by reference in its entirety.

BACKGROUND

1. Field

Embodiments of the disclosure relate to a process apparatus including a noncontact thermo-sensor and a method of adjusting a temperature in real time in performing a process.

2. Description of Related Art

In a semiconductor manufacturing process, a method of heating a workpiece for a short time is being widely used for increasing productivity. For example, technology for directly irradiating light onto a workpiece by using a heating lamp to heat the workpiece for a short time is being used. Also, since a process is very precisely performed, a temperature of a workpiece should be very accurately measured. In the related art, the temperature of the workpiece is measured by directly contacting a backside of the workpiece. However, since a front side of the workpiece is heated by light, a difference between a temporal temperature and a spatial temperature is large, and due to this, it is difficult to use a process of measuring a temperature of a backside of the workpiece.

However, related art is unable to measure a temperature by directly contacting the front side of the workpiece because a thermo-sensor is exposed to light. Therefore, in a process apparatus and a process of heating a workpiece by using a heating lamp, a temperature of a workpiece should be measured in real time by using a noncontact thermo-sensor such as a pyrometer. However, in a case which measures the temperature of the workpiece by using the noncontact thermo-sensor, a difference between a real temperature of the workpiece and a temperature measured by the noncontact thermo-sensor may be large due to the physical characteristic and optical characteristic of a surface of the workpiece, various influences caused by a heating lamp, process environments, etc. Particularly, when a wavelength band of light irradiated by the heating lamp overlaps a wavelength band of light received by the thermo-sensor for measuring a temperature, the reliability of measured temperature information is largely reduced.

SUMMARY

Some non-limiting example embodiments of the disclosure provide a method and apparatus for receiving light having a wavelength of 5 µm or more to measure a temperature of a workpiece.

Some non-limiting example embodiments of the disclosure provide an apparatus including a plurality of noncontact thermo-sensors and a plurality of heating lamps disposed to be vertical to a top surface of a workpiece.

Some non-limiting example embodiments of the disclosure provide a method and apparatus for measuring a temperature of a front side of a workpiece in real time by using a noncontact thermo-sensor.

Some non-limiting example embodiments of the disclosure provide a method and apparatus for turning on/off a plurality of heating lamps or adjusting a heating power of each of the plurality of heating lamps in real time on the basis of a temperature of a front side of a workpiece measured in real time.

According to some embodiments of the disclosure, a process apparatus is provided. The process apparatus includes a heating module; and a supporter disposed below the heating module, wherein a process space is provided between the heating module and the supporter, the heating module includes a housing, at least one heating lamp disposed in the housing, at least one temperature sensor disposed in the housing, and a blocking plate disposed under the housing, the blocking plate spatially separates the at least one heating lamp from the process space, and the blocking plate includes at least one window spatially connecting the at least one temperature sensor to the process space.

According to some embodiments of the disclosure, a method of manufacturing a semiconductor device is provided. The method includes: providing a workpiece on a supporter of a process apparatus, the process apparatus including a heating module, the supporter disposed below the heating module, and a process space between the heating module and the supporter, the heating module including a housing; at least one heating lamp and at least one temperature sensor disposed in the housing; and a blocking plate disposed under the housing, the blocking plate spatially separating the at least one heating lamp from the process space, and having a window spatially connecting a temperature sensor of the at least one temperature sensor to the process space. The method further includes heating the workpiece by using the at least one heating lamp; measuring a temperature of the workpiece by using the at least one temperature sensor; and performing a process while heating the workpiece.

According to some embodiments of the disclosure, a method of manufacturing a semiconductor device is provided. The method includes loading a workpiece onto a supporter disposed at a lower portion of a chamber; irradiating light onto the workpiece by using a plurality of heating lamps of a heating module disposed at an upper portion of the chamber to heat the workpiece; and receiving the light irradiated from the workpiece by using at least one temperature sensor of the heating module, wherein the light irradiated from each of the plurality of heating lamps onto the workpiece passes through a blocking plate, and the light irradiated from the workpiece and received by the at least one temperature sensor is transferred to the at least one temperature sensor without passing through the blocking plate.

Various aspects of the disclosure to solve will be described in detail in the detailed description.

BRIEF DESCRIPTION OF THE DRAWINGS

FIG. 4 is a side view schematically illustrating a process apparatus according to an embodiment of the disclosure.

DETAILED DESCRIPTION

Recently, semiconductor manufacturing processes are being performed in a progressively lowered temperature area. Particularly, like a gas assisted bonder, processes performed within a relatively low temperature range are increasing. Silicon or silicon base materials widely used in a semiconductor process are weak in irradiation of wavelengths of 5 μm or less, and due to this, it is difficult to accurately measure a relatively low temperature of 300° C. or less. Therefore, receiving of light having a wavelength of 5 μm or more is needed for accurately measuring a relatively low process temperature of 300° C. or less. As described above, in a process of heating a workpiece for a short time, the process is unable to measure a temperature of the workpiece by using a contact thermo-sensor. That is, in an apparatus and process of heating a workpiece with light, a temperature should be measured for a short time by using a noncontact thermo-sensor. Also, as described above, light having a wavelength of 5 μm or more should be received for accurately measuring a temperature of 300° C. or less. However, a plate including a generally used quartz material blocks most of light having a wavelength of 5 μm or more. In various embodiments of the disclosure, certain light does not pass through a plate including a quartz material while using a noncontact thermo-sensor, and therefore, a method and apparatus of receiving light having a wavelength of 5 μm or more to accurately measure a temperature of 300° C. or less are provided.

Figure 1A:
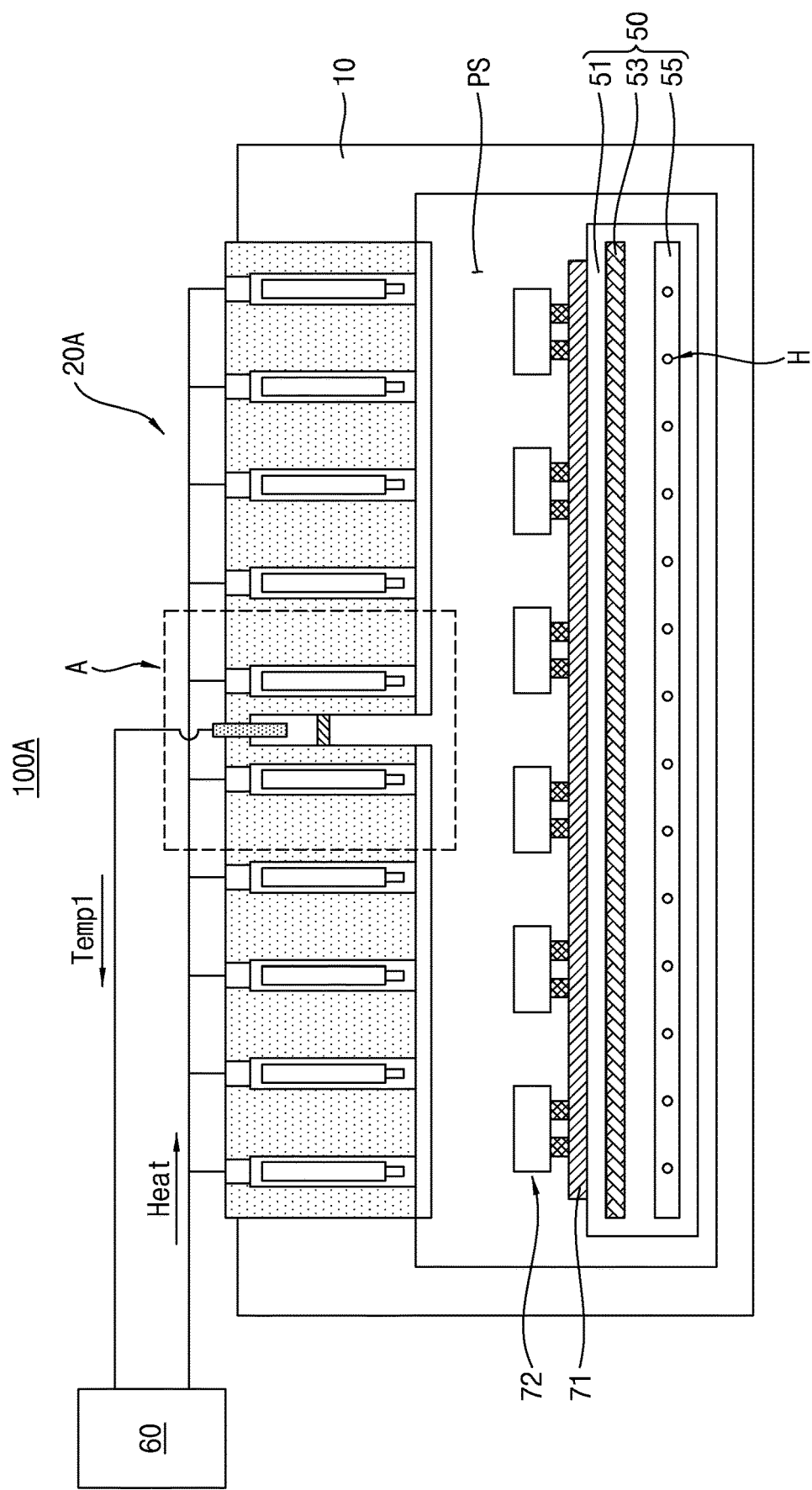
FIG. 1A is a side cross-sectional view schematically illustrating a process apparatus according to an embodiment of the disclosure.
Figure 1B:
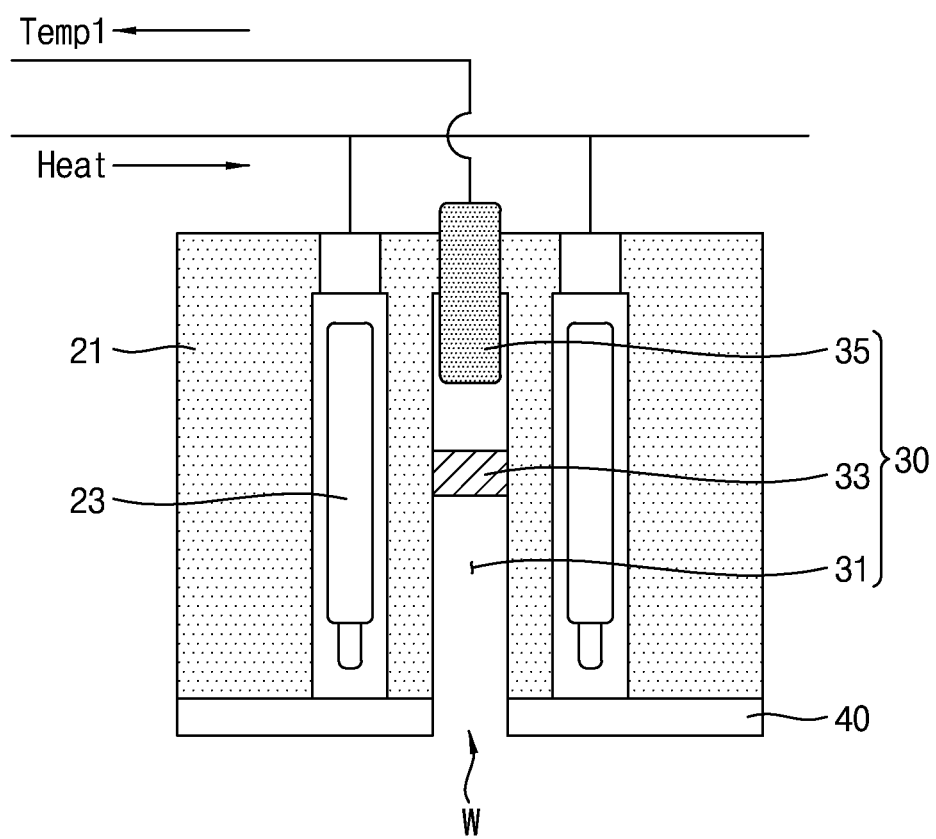
FIG. 1B is an enlarged view of a region A.

FIG. 1A is a side cross-sectional view schematically illustrating a process apparatus 100A according to an embodiment of the disclosure, and FIG. 1B is an enlarged view of a region A.

Referring to FIGS. 1A and 1B, the process apparatus 100A according to an embodiment of the disclosure may include a process chamber 10, a heating module 20A, a supporter 50, and a controller 60.

The process chamber 10 may provide a process space PS between the heating module 20A, disposed at an upper portion of the process chamber 10, and the supporter 50, disposed at a lower portion of the process chamber 10, for performing a process. For example, the process chamber 10 may include stainless steel.

The heating module 20A may be disposed at the upper portion of the process chamber 10 to heat a plurality of workpieces 71 and 72 and to measure temperatures of the workpieces 71 and 72.

The heating module 20A may include a housing 21, a plurality of the heating lamp 23, a temperature sensor 30, and a blocking plate 40.

The housing 21 may provide a main body which is coupled to the plurality of the heating lamp 23 and the temperature sensor 30. The housing 21 may include stainless steel.

The plurality of the heating lamp 23 may generate light to heat the plurality of workpieces 71 and 72. For example, the plurality of the heating lamp 23 may include a tungsten halogen lamp, a xenon lamp, a flash lamp, or other various lamps. The plurality of the heating lamp 23 may generate light having various wavelengths to irradiate the light onto the plurality of workpieces 71 and 72. For example, the plurality of the heating lamp 23 may generate light having a wavelength of 1 μm or less and 5 μm or more or light having various wavelengths. The plurality of the heating lamp 23 may be disposed to be vertical to a surface of the supporter 50. Therefore, the plurality of the heating lamp 23 may irradiate light onto a top surface of the supporter 50 and top surfaces of the plurality of workpieces 71 and 72 in a vertical direction. When light is irradiated onto the plurality of workpieces 71 and 72, light energy applied to a unit area may be highest. Accordingly, light irradiated by the plurality of the heating lamp 23 may efficiently heat the plurality of workpieces 71 and 72.

The temperature sensor 30 may include a light path 31, a filter 33, and a thermo-sensor 35.

The light path 31 may provide a path through which light (a radiant wave) having temperature information is transferred from the plurality of workpieces 71 and 72 to the thermo-sensor 35. The light path 31 may have a pipe or cylindrical shape that is an empty space. The light path 31 may be disposed to be vertical to the surface of the supporter 50. Therefore, the light path 31 may collect light irradiated or radiated in a vertical direction from the supporter 50 and the plurality of workpieces 71 and 72 and may transfer and provide the collected light to the thermo-sensor 35. When the light path 31 is vertical to the plurality of workpieces 71 and 72, the thermo-sensor 35 may be disposed at a shortest distance from the plurality of workpieces 71 and 72. Accordingly, the loss of temperature information based on a path may be minimized, and the thermo-sensor 35 may very accurately measure substantial temperatures of the plurality of workpieces 71 and 72.

The filter 33 may block light having a relatively short wavelength of less than 5 μm and may transmit light having a relatively long wavelength of 5 μm or more. As described above, temperature information about a temperature of 300° C. or less may be sufficiently transferred based on light having a relatively long wavelength of 5 μm or more. Light having a relatively short wavelength of less than 5 μm may act as noise and may be less useful to measure temperature information about a temperature of 300° C. or less. Therefore, the process apparatus 100A according to the disclosure may be very useful for a process of processing the plurality of workpieces 71 and 72 at a temperature of 300° C. or less.

The filter 33 may include germanium (Ge) or a compound of germanium base. The filter 33 may be disposed in the light path 31 and may be apart from the process space PS and the blocking plate 40. Since the filter 33 is apart from the process space PS, penetration of pollutants through the process space PS may be prevented. The filter 33 may have a mesh shape. The filter 33 may include a relatively narrow bottom surface and a relatively wide top surface. In a perspective view, the filter 33 may have a truncated cone shape. In a top view or a bottom view, the filter 33 may have a circular plate shape. A sealant may be disposed between the filter 33 and the housing 21.

The thermo-sensor 35 may include a noncontact thermo-sensor such as a pyrometer or an infrared (IR) sensor. The thermo-sensor 35 may analyze light transferred and provided from the plurality of workpieces 71 and 72 to measure temperatures of the workpieces 71 and 72. Particularly, the thermo-sensor 35 may analyze light information having a wavelength of 5 μm or more to provide the controller 60 with temperature information Temp1 about the plurality of workpieces 71 and 72.

The blocking plate 40 may be disposed at a whole lower portion of the heating module 20A. The blocking plate 40 may spatially separate the plurality of the heating lamp 23 from the process space PS. Therefore, the blocking plate 40 may prevent the plurality of the heating lamp 23 from being polluted by pollutants which occur in the process space PS. The blocking plate 40 may include quartz. The blocking plate 40 may include a window W which opens a lower area of the temperature sensor 30. Therefore, the temperature sensor 30 may be exposed at the process space PS, and the light path 31 of the temperature sensor 30 may be spatially connected to the process space PS.

The supporter 50 may support the plurality of workpieces 71 and 72. The supporter 50 may include a supporting plate 51, a heater 53, and a cooler 55, and the heater 53 and the cooler 55 may be embedded into the supporting plate 51. The heater 53 may include a heating coil and may directly heat the plurality of workpieces 71 and 72 placed on the supporting plate 51. The cooler 55 may circulate a refrigerant such as water through a plurality of cooling holes H provided therein to cool the supporting plate 51. A temperature of the supporting plate 51 may be maintained to be constant by operations of the heater 53 and the cooler 55.

The controller 60 may receive the temperature information Temp 1 measured from the thermo-sensor 35 and may transmit a heating command Heat to the plurality of the heating lamp 23. The controller 60 may analyze the temperature information Temp1 and may transmit, to each of the heating lamp 23, the heating command Heat for individually turning on/off the heating lamp 23 or adjusting a heating power of each of the heating lamp 23.

The plurality of workpieces 71 and 72 may include a wafer and/or a plurality of bonding chips. For example, the workpiece 71 may include a wafer, and the plurality of workpieces 72 may include a plurality of bonding chips. For example, a die bonding process or a chip bonding process of bonding the plurality of bonding chips on the wafer may be performed in the process apparatus 100A according to the disclosure. In an embodiment of the disclosure, in a case where a plurality of processes (for example, a deposition process, an etching process, an implant process, etc.) of directly processing the wafer in the process apparatus 100A are performed, the workpiece 72 including the plurality of bonding chips may be omitted.

Figure 2A:
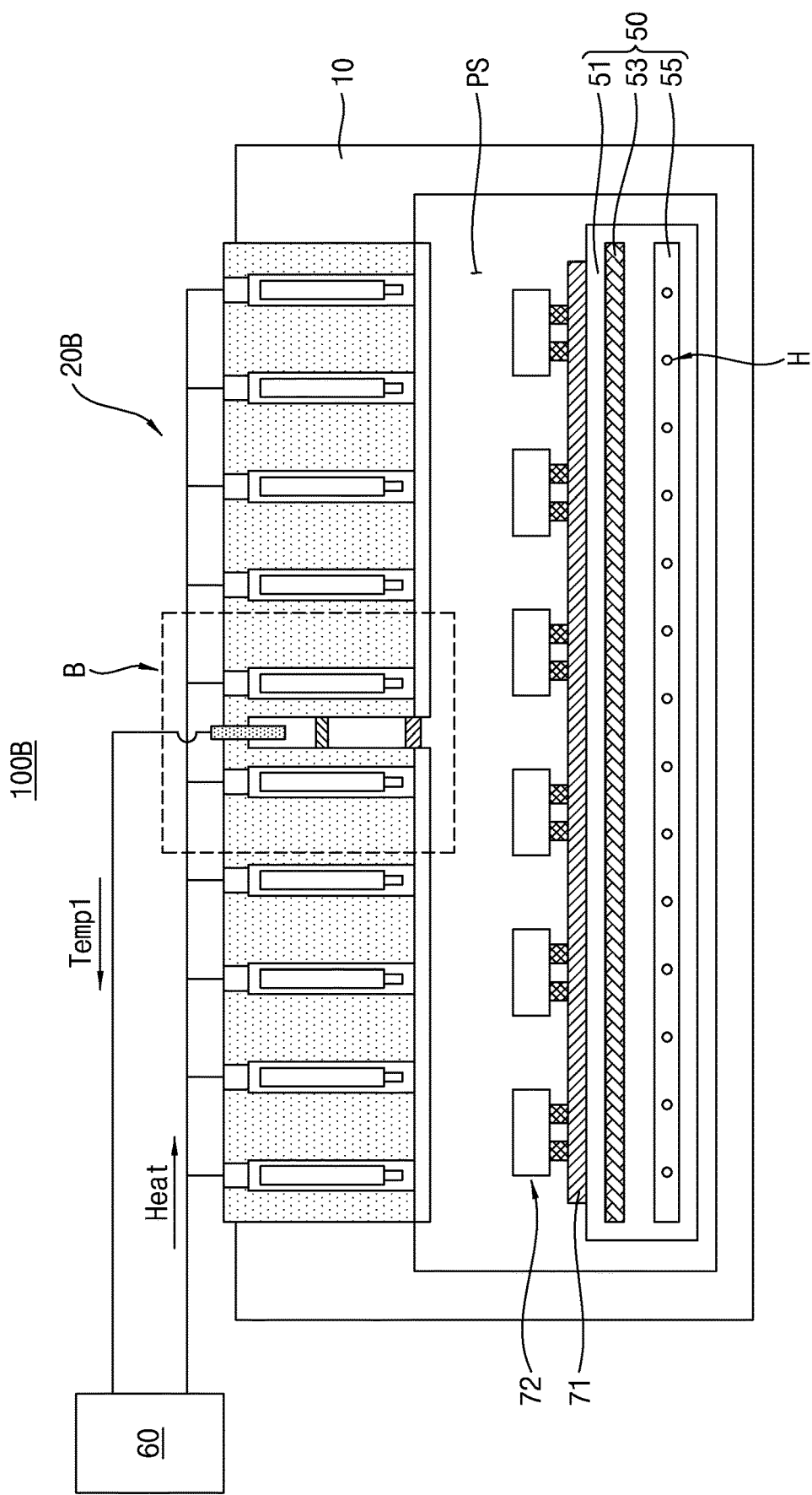
FIG. 2A is a side cross-sectional view illustrating a process apparatus according to an embodiment of the disclosure.
Figure 2B:
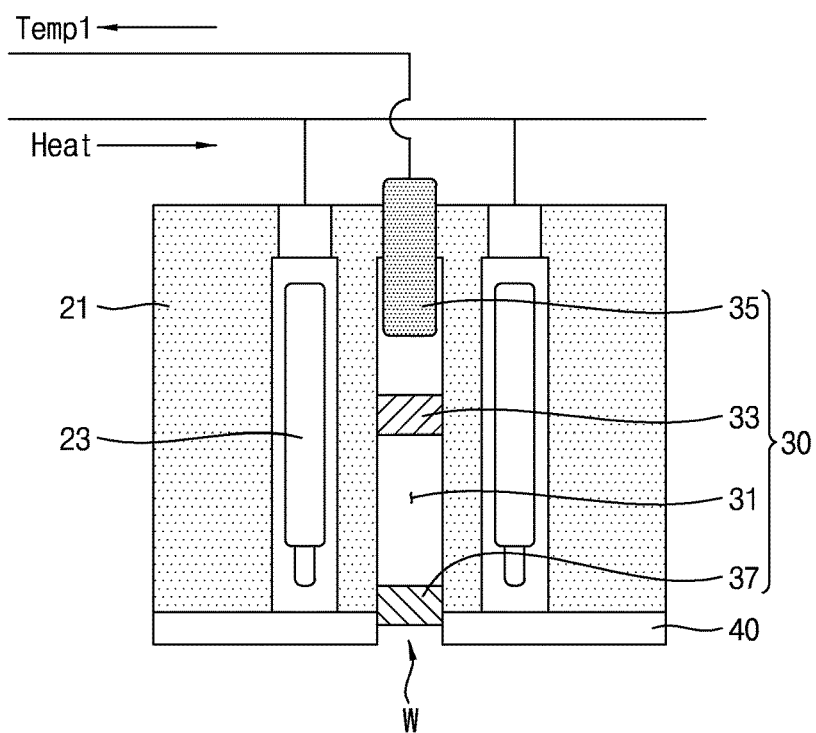
FIG. 2B is an enlarged view of a region A of the process apparatus illustrated in FIG. 2A.

FIG. 2A is a side cross-sectional view illustrating a process apparatus 100B according to an embodiment of the disclosure, and FIG. 2B is an enlarged view of a region A. Referring to FIGS. 2A and 2B, the process apparatus 100B according to an embodiment of the disclosure may include a process chamber 10, a heating module 20B, a supporter 50, and a controller 60. The heating module 20B may include a housing 21, a plurality of the heating lamp 23 disposed in the housing 21, a temperature sensor 30, and a blocking plate 40 disposed under the housing 21. The temperature sensor 30 may include a light path 31, a filter 33, a thermo-sensor 35, and a blocking block 37.

The blocking block 37 may be disposed in a lower area of the light path 31 of the temperature sensor 30. The blocking block 37 may spatially separate the process space PS from the light path 31, the filter 33, and the thermo-sensor 35. Therefore, the blocking block 37 may prevent pollutants, occurring in the process space PS, from polluting the light path 31 and the filter 33. The blocking block 37 may transmit light having a relatively long wavelength of 5 μm or more. A portion of light having a wavelength of less than 5 μm may pass through the blocking block 37. The blocking block 37 may include zinc selenide (ZnSe). A lower end of the blocking block 37 may be disposed at a level which is higher than a bottom surface of the blocking plate 40. The blocking block 37 may horizontally and partially overlap a window W of the blocking plate 40. In an embodiment, a bottom surface of the blocking block 37 and the bottom surface of the blocking plate 40 may be disposed at levels which are similar or substantially the same. The blocking block 37 may have a mesa shape. The blocking block 37 may have a relatively narrow bottom surface and a relatively wide top surface. In a perspective view, the blocking block 37 may have an inversely truncated cone shape. In a top view or a bottom view, the blocking block 37 may have a circular plate shape. A sealant may be disposed between the blocking block 37 and the blocking plate 40.

FIGS. 3A to 3E are top views of a plurality of heating modules 20C to 20F according to various embodiments of the disclosure.

Figure 3A:
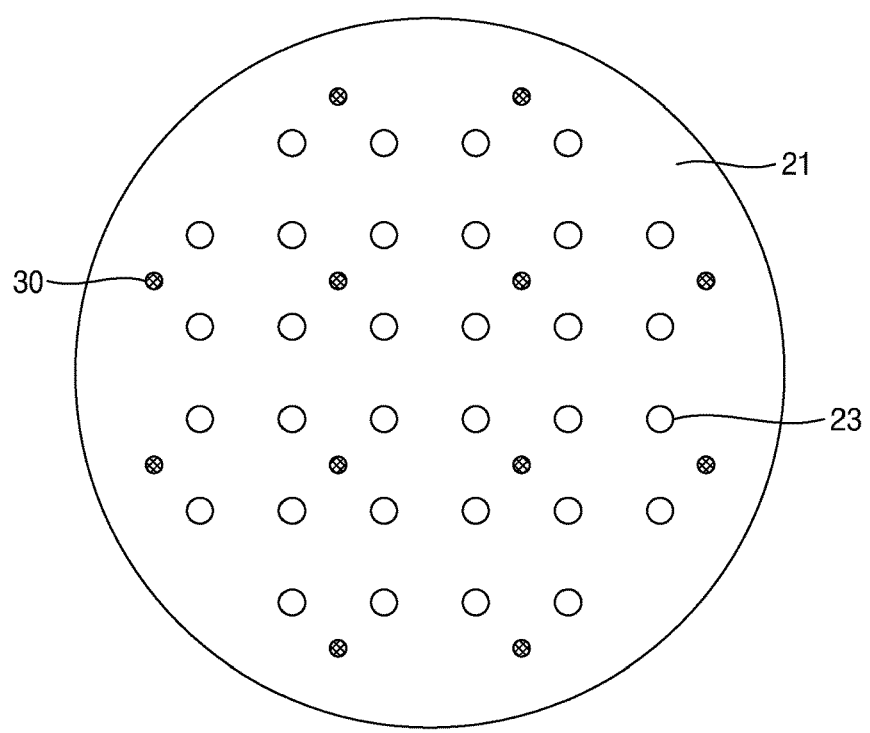
FIG. 3A is a top view of a heating module according to an embodiment of the disclosure.

Referring to FIG. 3A, the heating module 20C according to an embodiment of the disclosure may include a housing 21, a plurality of the heating lamp 23, and a plurality of the temperature sensor 30. The plurality of the heating lamp 23 may be arranged in a lattice shape in the housing 21, and the plurality of the temperature sensor 30 may be selectively arranged in a lattice shape between the plurality of the heating lamp 23. The number of the temperature sensor 30 may be less than the number of the heating lamp 23. The plurality of the heating lamp 23 may be independently turned on/off. Alternatively, a heating power of each of the plurality of the heating lamp 23 may be independently adjusted. The plurality of the heating lamp 23 may be regularly arranged, and the plurality of the temperature sensor 30 may be irregularly arranged.

Figure 3B:
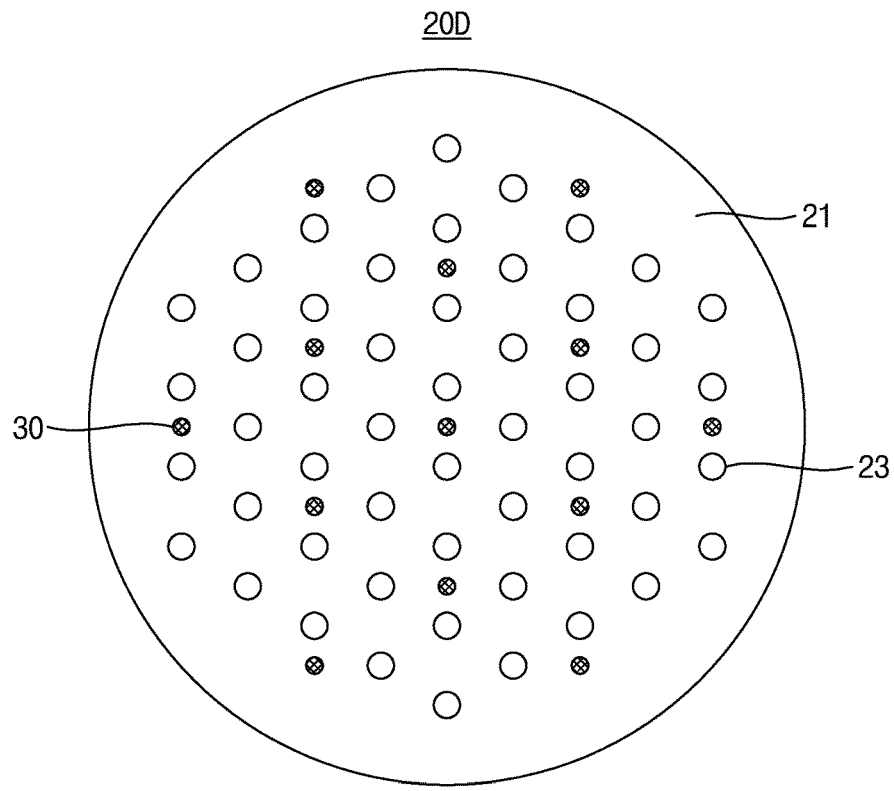
FIG. 3B is a top view of a heating module according to an embodiment of the disclosure.

Referring to FIG. 3B, the heating module 20D according to an embodiment of the disclosure may include a housing 21, a plurality of the heating lamp 23, and a plurality of the temperature sensor 30. The plurality of the heating lamp 23 may be selectively arranged in a zigzag shape or a diagonal shape in the housing 21, and the plurality of the temperature sensor 30 may be selectively arranged between the plurality of the heating lamp 23 in a zigzag shape or a diagonal shape. The number of the temperature sensor 30 may be less than the number of the heating lamp 23. The plurality of the heating lamp 23 may be regularly arranged, and the plurality of the temperature sensor 30 may be irregularly arranged.

Figure 3C:
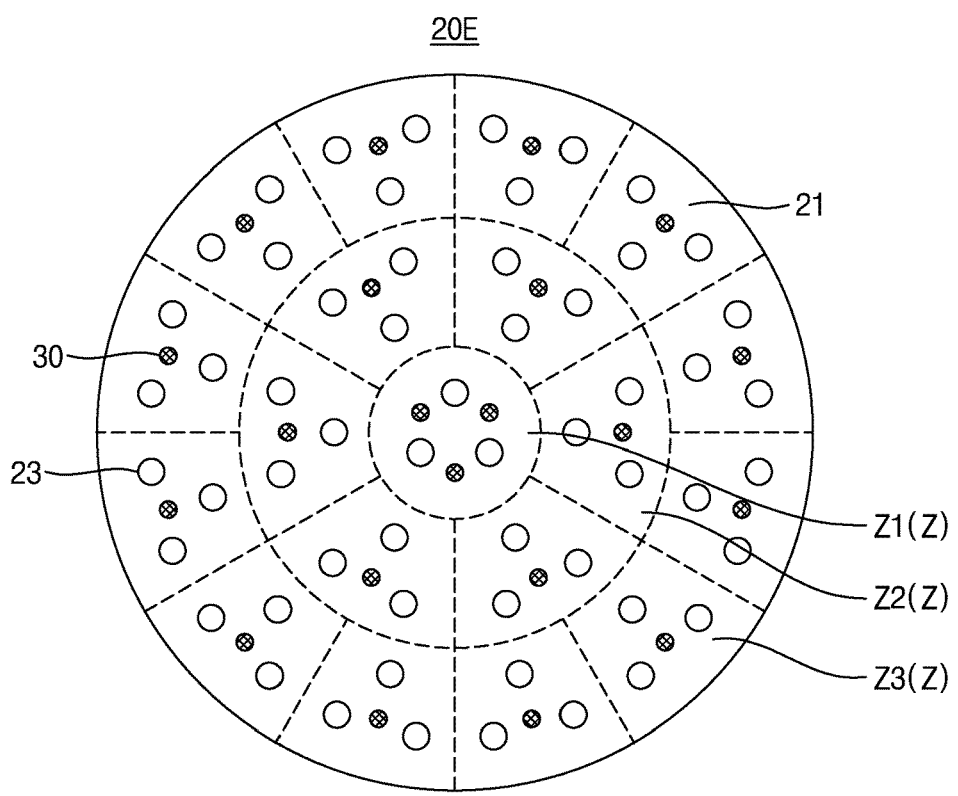
FIG. 3C is a top view of a heating module according to an embodiment of the disclosure.

Referring to FIG. 3C, the heating module 20E according to an embodiment of the disclosure may include a housing 21, a plurality of the heating lamp 23, and a plurality of the temperature sensor 30. The plurality of the heating lamp 23 and the plurality of the temperature sensor 30 may be disposed apart from one another in a plurality of areas Z. The plurality of areas Z may be virtually separated from one another, and thus, are illustrated by a dotted line. The number of the temperature sensor 30 may be less than the number of the heating lamp 23. The plurality of the heating lamp 23 respectively disposed apart from one another in the plurality of areas Z may simultaneously operate in common. For example, some of the plurality of the heating lamp 23 disposed in the same area Z may be simultaneously turned on/off, and/or, heating powers of the some of the plurality of the heating lamp 23 may be simultaneously adjusted. At least one of the plurality of the temperature sensor 30 may be disposed in each of the plurality of areas Z. In FIG. 3C, it is illustrated that three of the plurality of the heating lamp 23 and one of the plurality of the temperature sensor 30 are disposed in one area Z, but this is merely an example. One or more of the plurality of the heating lamp 23 may be disposed in one area Z. Also, the plurality of the heating lamp 23 may be arranged in a polygonal shape, a lattice shape, a zigzag shape, a radial shape, or the other various geometrical shapes. In FIG. 3C, a center area Z1 and a plurality of peripheral areas Z2 and Z3 may each correspond to a respective one of the plurality of areas Z. In an embodiment, the center area Z1 may have a circular shape. In an embodiment, the center area Z1 may have a polygonal shape. For example, the plurality of peripheral areas Z2 and Z3 may form a disk shape. In an embodiment, the plurality of peripheral areas Z2 and Z3 may form a frame shape or a polygonal rim shape. For example, the peripheral areas Z2 may be a plurality of internal peripheral areas forming an internal disk shape and the peripheral areas Z3 may be a plurality of external peripheral areas forming an external disk shape. In an embodiment, the plurality of peripheral areas Z2 and Z3 may form three or more disk-shaped areas. For example, additional peripheral areas may be further formed between the center area Z1 and the plurality of peripheral areas Z2, between the plurality of peripheral areas Z2 and the plurality of peripheral areas Z3, or outside the plurality of peripheral areas Z3. The plurality of the heating lamp 23 may be regularly arranged, and the plurality of the temperature sensor 30 may be irregularly arranged.

Figure 3D:
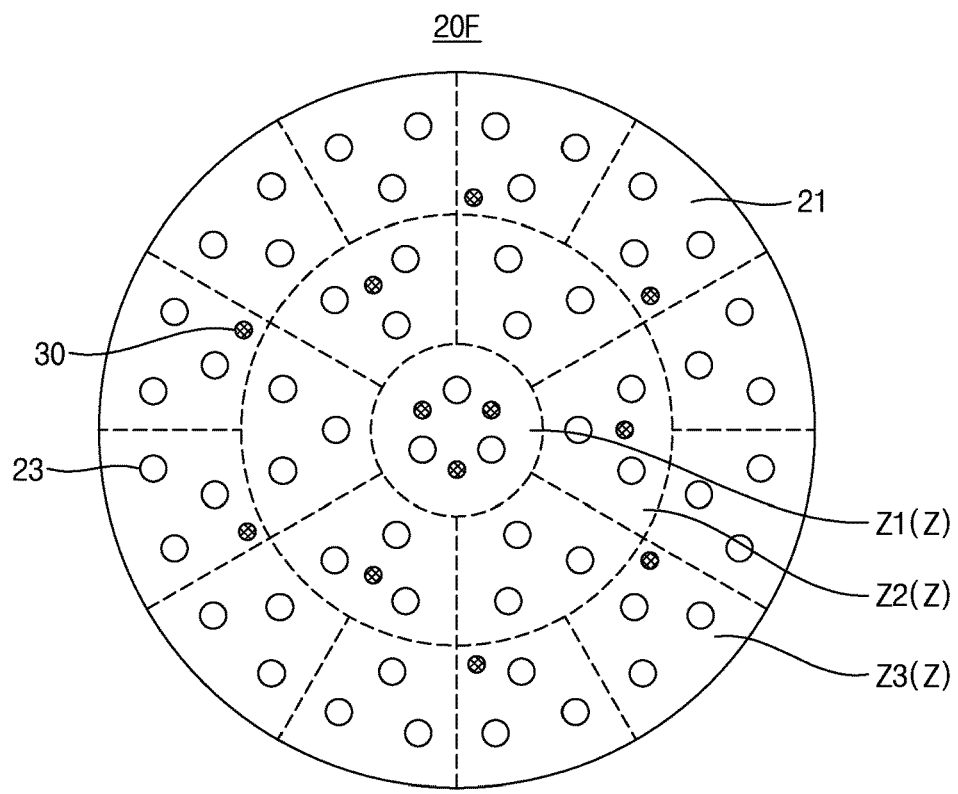
FIG. 3D is a top view of a heating module according to an embodiment of the disclosure.

Referring to FIG. 3D, the heating module 20F according to an embodiment of the disclosure may include a housing 21, a plurality of the heating lamp 23, and a plurality of the temperature sensor 30. The plurality of the heating lamp 23 may be disposed apart from one another in the plurality of areas Z, and the plurality of the temperature sensor 30 may be selectively disposed in some of the plurality of areas Z. The arrangement of the plurality of the temperature sensor 30 illustrated in FIG. 3D is merely an example. The plurality of the temperature sensor 30 may be disposed in various shapes at various positions. The plurality of the heating lamp 23 may be regularly arranged, and the plurality of the temperature sensor 30 may be irregularly arranged.

Figure 3E:
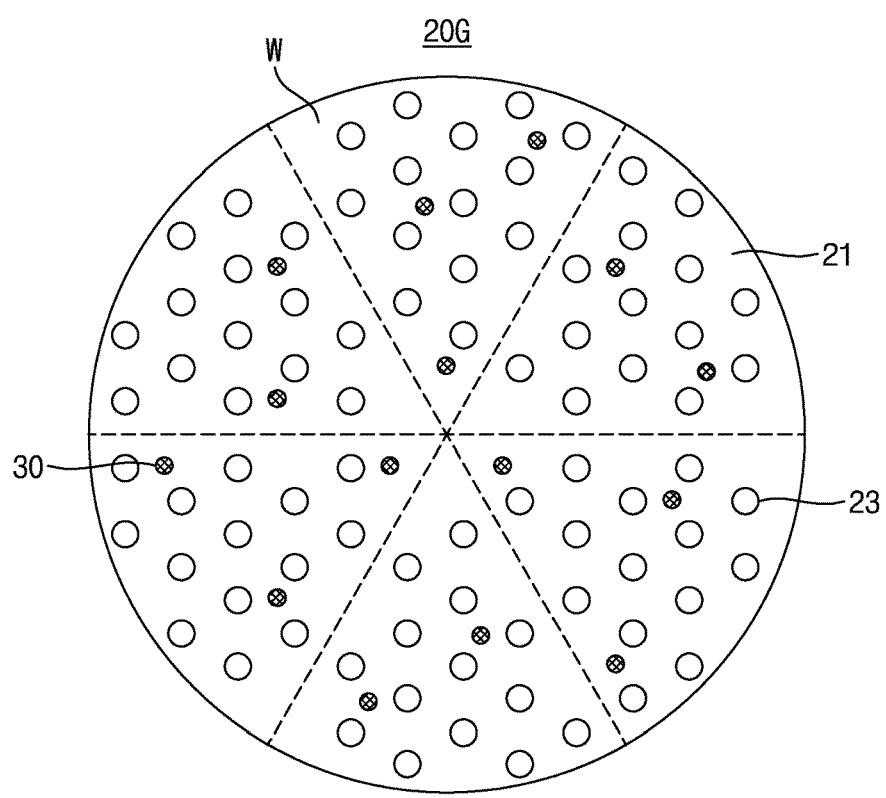
FIG. 3E is a top view of a heating module according to an embodiment of the disclosure.

Referring to FIG. 3E, the heating module 20G according to an embodiment of the disclosure may include a housing 21, a plurality of the heating lamp 23, and a plurality of the temperature sensor 30. The plurality of the heating lamp 23 and the plurality of the temperature sensor 30 may be distributed and disposed in a plurality of sector-shaped areas W. For example, the plurality of the heating lamp 23 may be arranged in a diagonal lattice shape or a zigzag shape, and the plurality of the temperature sensor 30 may be selectively disposed between the plurality of the heating lamp 23. The arrangement of the plurality of the temperature sensor 30 illustrated in FIG. 3E is merely an example. The plurality of the temperature sensor 30 may be disposed in various shapes. Also, it is illustrated that the plurality of sector-shaped areas W are virtually divided into six portions, but the plurality of sector-shaped areas W may be virtually divided into six or more portions. The plurality of the heating lamp 23 may be regularly arranged, and the plurality of the temperature sensor 30 may be irregularly arranged.

Figure 3F:
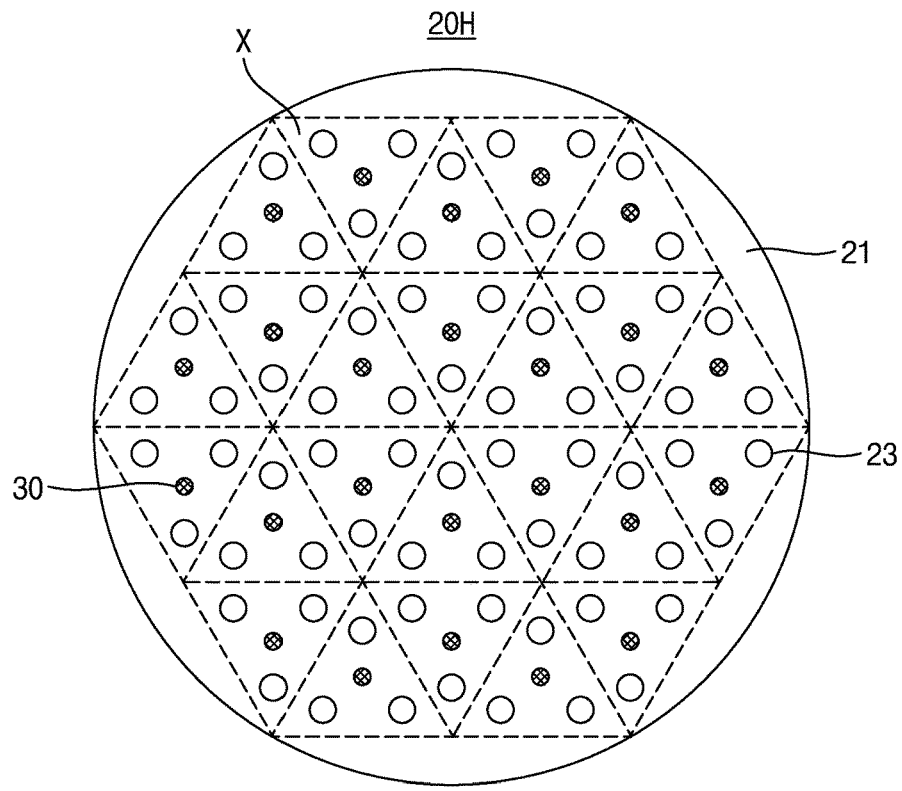
FIG. 3F is a top view of a heating module according to an embodiment of the disclosure.

Referring to FIG. 3F, the heating module 20H according to an embodiment of the disclosure may include a housing 21, a plurality of the heating lamp 23, and a plurality of the temperature sensor 30. The plurality of the heating lamp 23 and the plurality of the temperature sensor 30 may be disposed apart from one another in a plurality of triangular areas X. In an embodiment, the plurality of the temperature sensor 30 may be selectively disposed in the plurality of triangular areas X. The plurality of triangular areas X may be virtually separated from one another. The plurality of the heating lamp 23 may be regularly arranged, and the plurality of the temperature sensor 30 may be irregularly arranged.

Figure 3G:
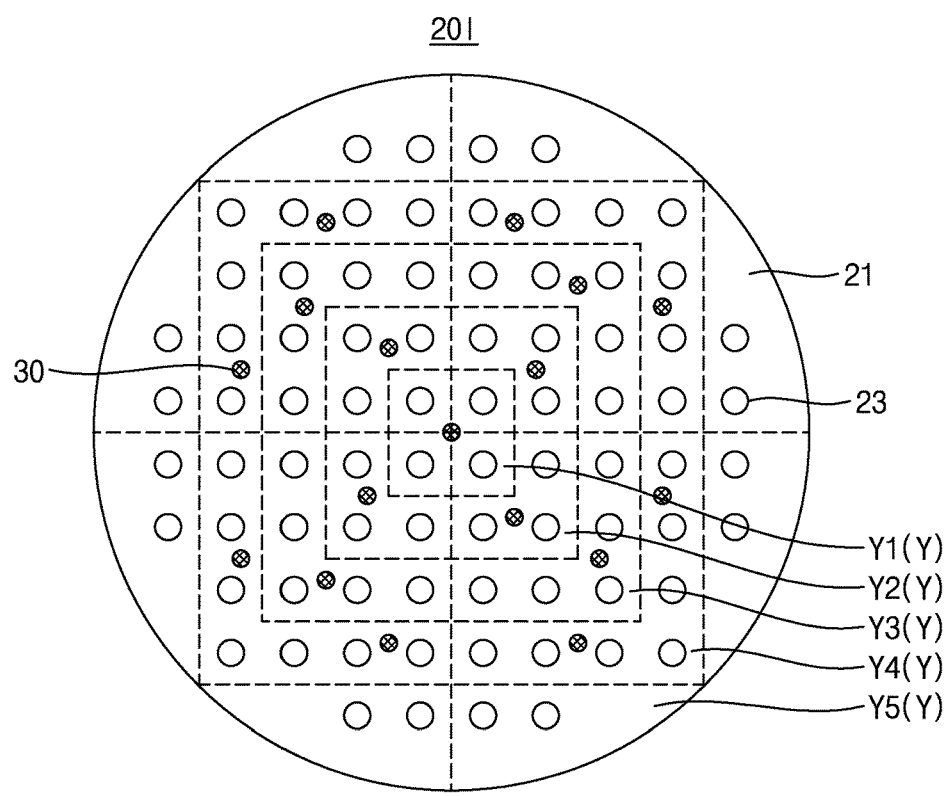
FIG. 3G is a top view of a heating module according to an embodiment of the disclosure.

Referring to FIG. 3G, the heating module 20I according to an embodiment of the disclosure may include a housing 21, a plurality of the heating lamp 23, and a plurality of the temperature sensor 30. The plurality of the heating lamp 23 and the plurality of the temperature sensor 30 may be disposed in a center area Y1 and a plurality of peripheral areas Y2 to Y5. For example, the center area Y1 may have a tetragonal shape, and the plurality of peripheral areas Y2 to Y5 may each have a frame shape. In an embodiment, the plurality of the temperature sensor 30 may be selectively disposed at various positions in a plurality of tetragonal areas Y (e.g. each of the center area Z1 and the peripheral areas Y2 to Y5). The plurality of tetragonal areas Y may be virtually separated from one another. The plurality of the heating lamp 23 may be regularly arranged, and the plurality of the temperature sensor 30 may be irregularly arranged.

FIG. 4 is a side view schematically illustrating a process apparatus 100C according to an embodiment of the disclosure. Referring to FIGS. 3A to 3E and 4, the process apparatus 100C according to an embodiment of the disclosure may include the process chamber 10, the heating module 20H, the supporter 50, and the controller 60. The heating module 20H may include the housing 21, a plurality of the heating lamp 23 disposed in the housing 21, a plurality of the temperature sensor 30, and the blocking plate 40 disposed under the housing 21.

Figure 5A:
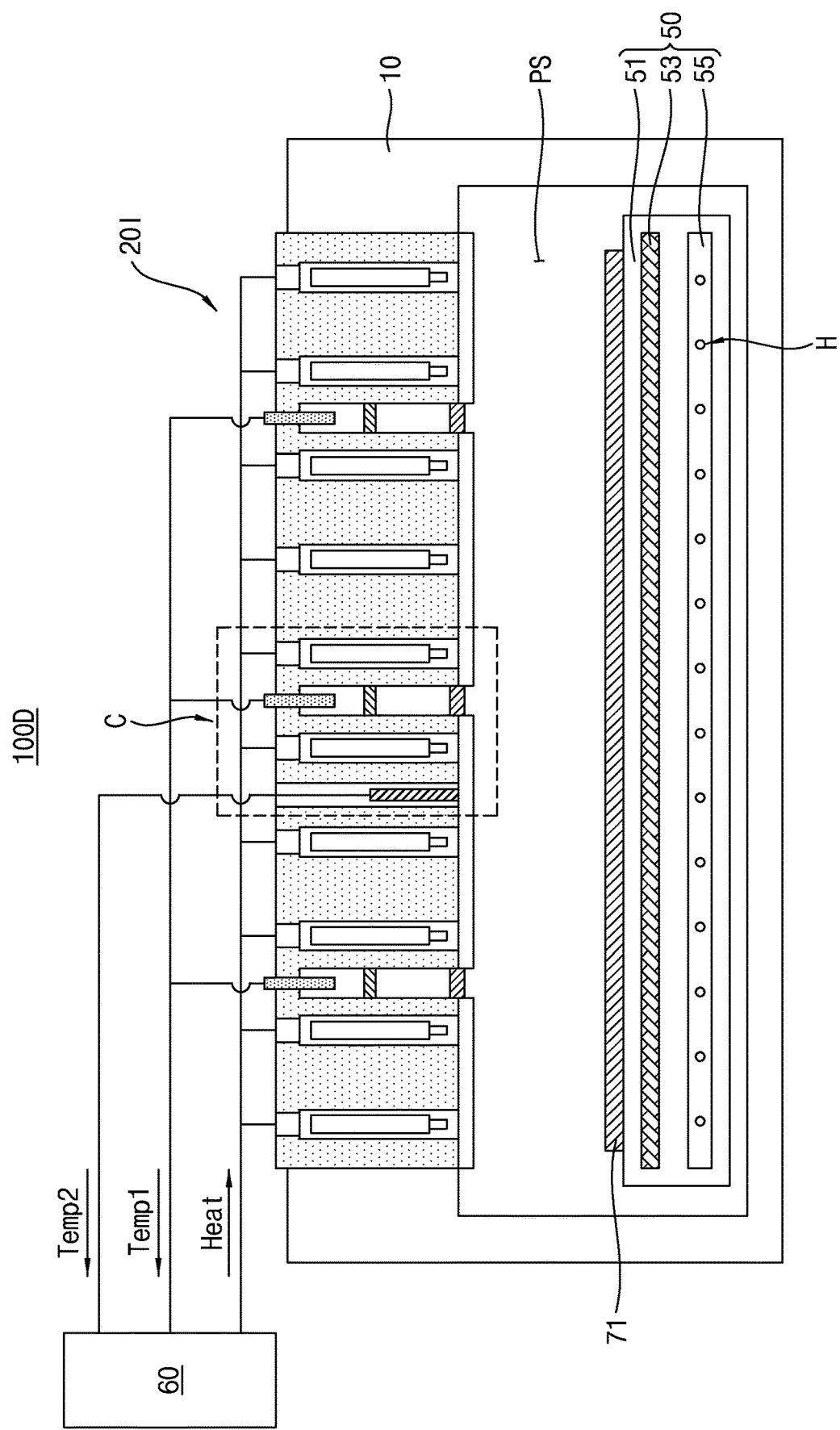
FIG. 5A is a side view illustrating a process apparatus according to an embodiment of the disclosure.
Figure 5B:
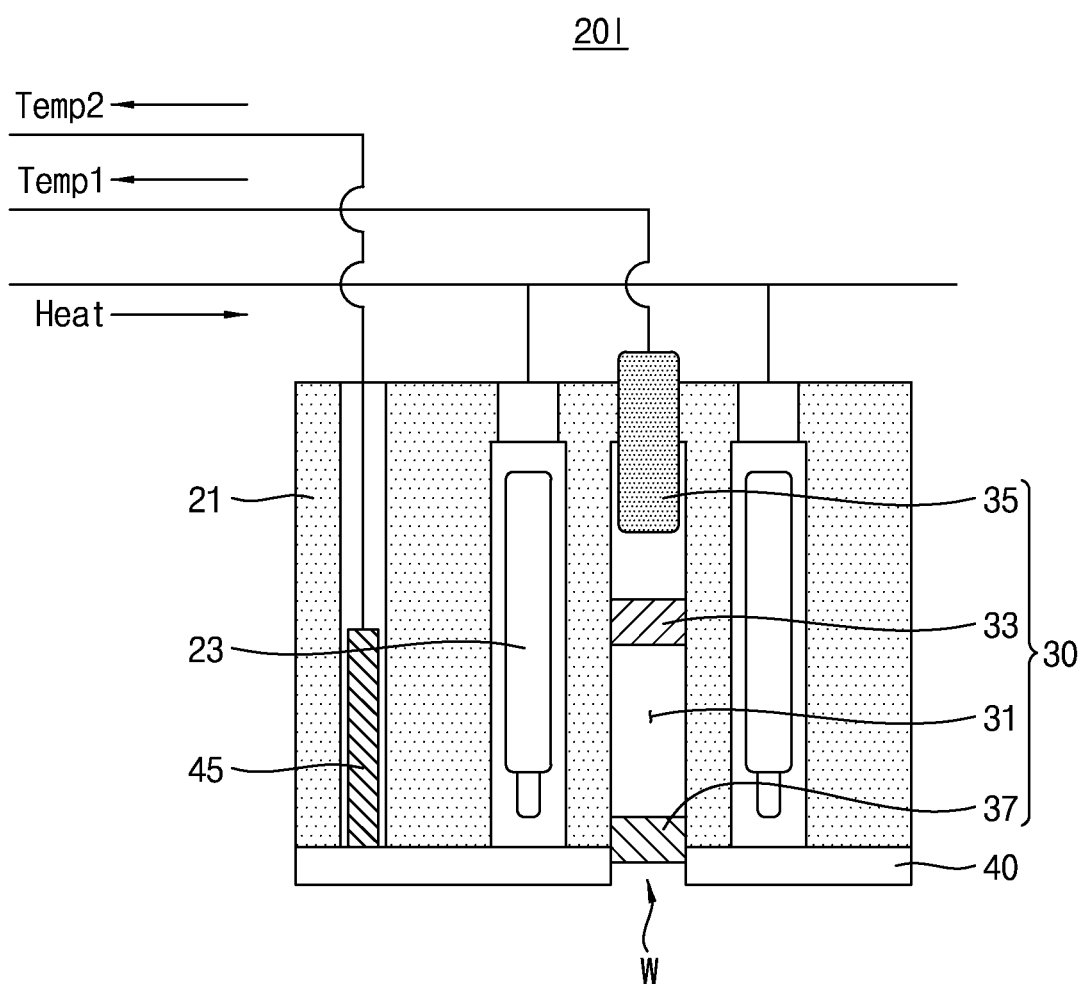
FIG. 5B is an enlarged view of a region C of the process apparatus illustrated in FIG. 5A.

FIG. 5A is a side view illustrating a process apparatus 100D according to an embodiment of the disclosure, and FIG. 5B is an enlarged view of a region C.

Referring to FIGS. 5A and 5B, the process apparatus 100D according to an embodiment of the disclosure may include the process chamber 10, the heating module 20I, the supporter 50, and the controller 60. The heating module 20I may include the housing 21, a plurality of the heating lamp 23 disposed in the housing 21, the temperature sensor 30, an upper contact thermo-sensor 45, and the blocking plate 40. The upper contact thermo-sensor 45 may directly contact the blocking plate 40. The upper contact thermo-sensor 45 may sense a temperature of the blocking plate 40 to provide the controller 60 with temperature information Temp2 about the blocking plate 40.

Figure 6:
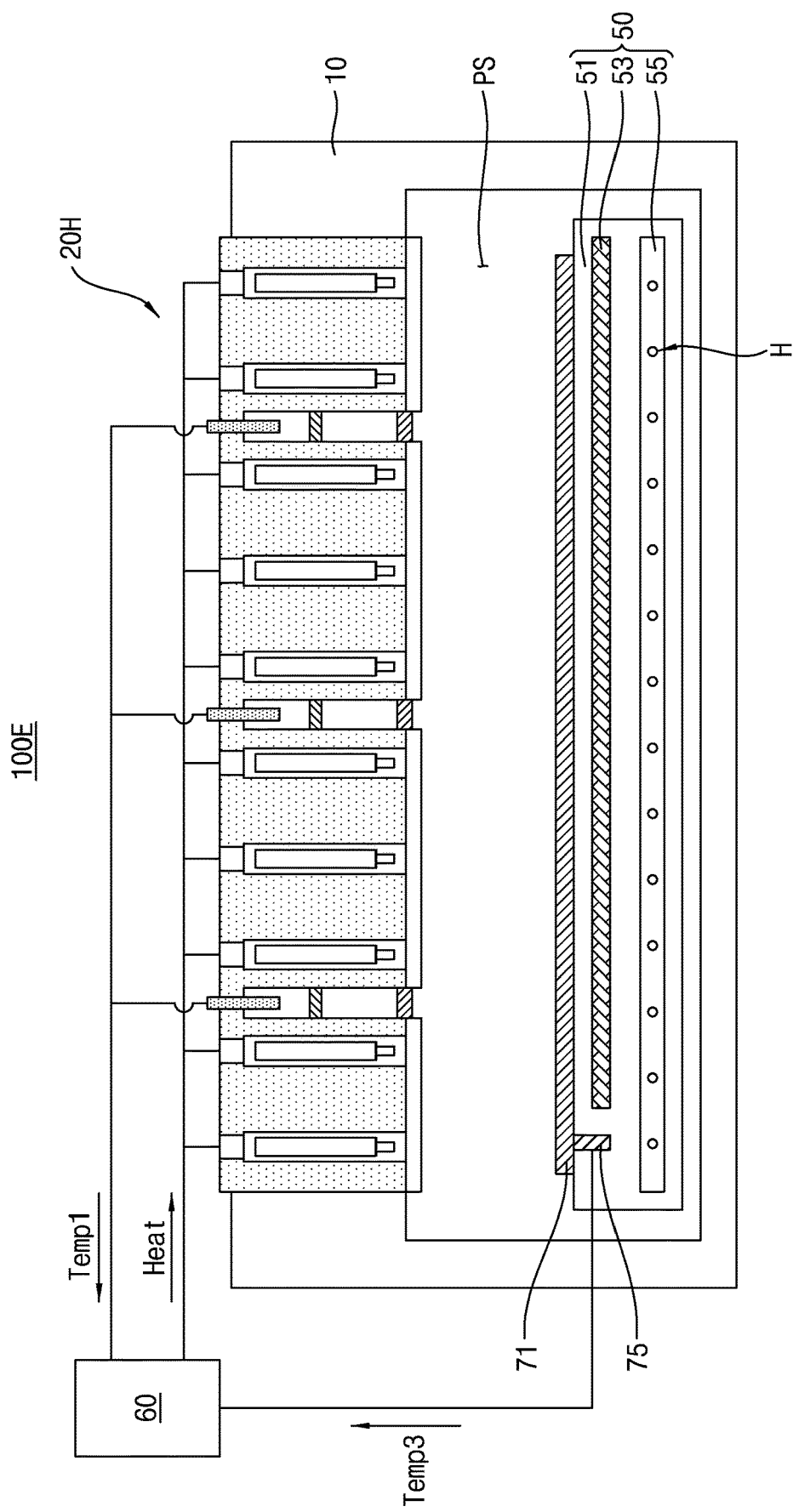
FIG. 6 is a side view schematically illustrating a process apparatus according to an embodiment of the disclosure.

FIG. 6 is a side view schematically illustrating a process apparatus 100E according to an embodiment of the disclosure. Referring to FIG. 6, the process apparatus 100E according to an embodiment of the disclosure may include the process chamber 10, the heating module 20H, the supporter 50, and the controller 60. The heating module 20H may include the housing 21, a plurality of the heating lamp 23 disposed in the housing 21, a plurality of the temperature sensor 30, and the blocking plate 40. The supporter 50 may include the supporting plate 51 and the heater 53, the cooler 55, and a lower contact thermo-sensor 75 each embedded into the supporting plate 51. The lower contact thermo-sensor 75 may directly contact the supporting plate 51 or the workpiece 71. The lower contact thermo-sensor 75 may sense a temperature of the supporting plate 51 or a workpiece to provide the controller 60 with temperature information Temp3.

Figure 7:
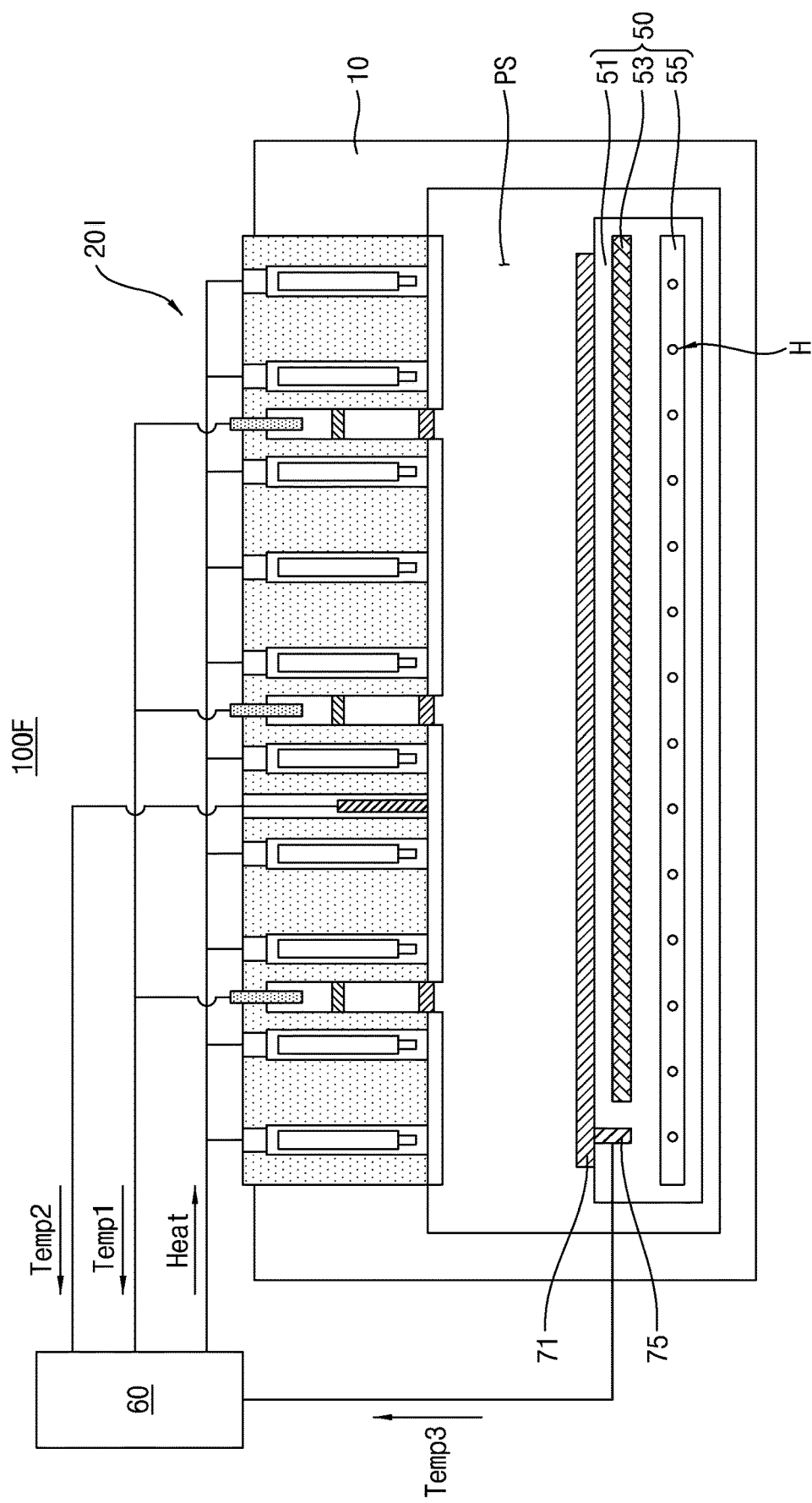
FIG. 7 is a side view schematically illustrating a process apparatus according to an embodiment of the disclosure.

FIG. 7 is a side view schematically illustrating a process apparatus 100F according to an embodiment of the disclosure. Referring to FIG. 7, the process apparatus 100F according to an embodiment of the disclosure may include the process chamber 10, the heating module 20I, the supporter 50, and the controller 60. The heating module 20I may include the housing 21, the plurality of the heating lamp 23 disposed in the housing 21, the temperature sensor 30, the upper contact thermo-sensor 45, and the blocking plate 40. The supporter 50 may include the supporting plate 51, and the heater 53, the cooler 55, and the lower contact thermo-sensor 75 each embedded into the supporting plate 51. The upper contact thermo-sensor 45 may directly contact the blocking plate 40 and may transfer temperature information Temp2 about the blocking plate 40 to the controller 60. The lower contact thermo-sensor 75 may directly contact the supporting plate 51 or a workpiece 71 and may transfer temperature information Temp3 about the supporting plate 51 or the workpiece 71 to the controller 60.

Figure 8:
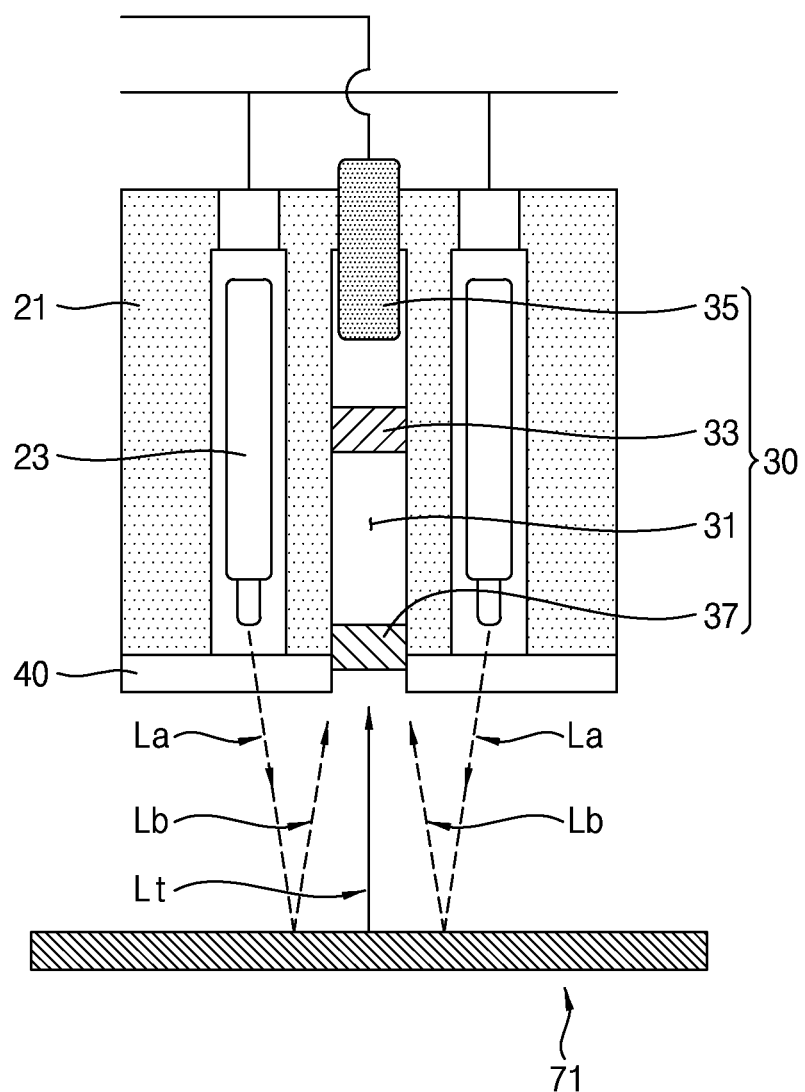
FIG. 8 is a diagram describing an operation of measuring a temperature of a workpiece by using a temperature sensor of a heating module of each of a plurality of process apparatuses according to embodiments of the disclosure.

FIG. 8 is diagram describing an operation of measuring a temperature of a workpiece 71 by using a temperature sensor 30 of a heating module (e.g. one of heating modules 20A-L) of each of a plurality of the process apparatus (e.g. process apparatuses 100A-F) according to embodiments of the disclosure.

Referring to FIG. 8, the temperature sensor 30 may receive all of light Lt irradiated or radiated from the workpiece 71 and light Lb reflected from a surface of the workpiece 71. For example, the light Lt irradiated or radiated from the workpiece 71 may include temperature information about the workpiece 71. Light La irradiated from each of a plurality of the heating lamp 23 onto the workpiece 71 may be the light Lb reflected from the surface of the workpiece 71, and thus, the light Lb reflected from the surface of the workpiece 71 may not include the temperature information about the workpiece 71. That is, the light Lb reflected from the surface of the workpiece 71 may be a noise component.

Generally, the workpiece 71 may include silicon or a material of silicon base. Silicon may be low in irradiation rate of light having a wavelength of less than 5 μm and may be high in irradiation rate of light having a wavelength of 5 μm or more. The light Lt irradiated or radiated from the workpiece 71 may mainly include light having a wavelength of 5 μm or more.

The light La irradiated from each of the plurality of the heating lamp 23 may pass through the blocking plate 40 and may be provided to the workpiece 71. As described above, the blocking plate 40 may include quartz, and thus, the light La irradiated onto the workpiece 71 may include only light which has a wavelength of less than 5 μm under a condition where light having a wavelength of 5 μm or more is blocked by the blocking plate 40. That is, the light Lb reflected from the surface of the workpiece 71 may include light having a wavelength of less than 5 μm. Accordingly, accurate temperature information about the workpiece 71 may be obtained by removing a component of the light Lb reflected from the surface of the workpiece 71 from among the lights Lt and Lb received by the temperature sensor 30.

The temperature sensor 30 according to various embodiments of the disclosure may include the filter 33 which blocks light having a wavelength of less than 5 μm and transmits light having a wavelength of 5 μm or more. Accordingly, the process apparatuses according to various embodiments of the disclosure may measure an accurate temperature of the workpiece 71.

This will be described as expressed in the following Equation 1.

$$T(\text{total}) = T(Lt) + T(Lb) \quad \text{[Equation 1]}$$

Here, T(total) may denote total temperature information, T(Lt) may denote temperature information about the light Lt, and T(Lb) may denote temperature information about the light Lb.

In this case, most of the temperature information T(Lb) about the light Lb may be blocked by the filter 33. That is, temperature information Temp1 provided from the temperature sensor 30 to the controller 60 may be similar to the temperature information T(Lt) about the light Lt irradiated from the workpiece 71.

The accurate temperature of the workpiece 71 may be obtained by removing a noise component from the temperature information Temp1 provided from the temperature sensor 30 to the controller 60. The noise component may include various components such as a temporal difference and temperature information about elements other than the workpiece 71, in addition to the light Lb reflected from the workpiece 71. In an embodiment, the accurate temperature of the workpiece 71 may be estimated by comparing the temperature information Temp1, provided from the temperature sensor 30 to the controller 60, with temperature information Temp2 about the blocking plate 40. For example, referring to FIGS. 5A and 5B, an accurate real temperature of the workpiece 71 may be estimated by comparing the temperature information Temp1 with the temperature information Temp2 about the blocking plate 40. In an embodiment, the accurate temperature of the workpiece 71 may be estimated by comparing the temperature information Temp1, provided from the temperature sensor 30 to the controller 60, with temperature information Temp3 about the supporting plate 51 or a backside of the workpiece 71. For example, referring to FIG. 6, an accurate real temperature of the workpiece 71 may be estimated by comparing the temperature information Temp1 with temperature information Temp3 about the supporting plate 51 or the backside of the workpiece 71.

The temperature information Temp1 measured by the temperature sensor 30, the temperature information Temp2 about the blocking plate 40, and the temperature information Temp3 about the supporting plate 51 or the backside of the workpiece 71 may have various distributions such as the kind, material, process kind, process temperature, process pressure, and various process conditions of the workpiece 71. Therefore, a process of estimating the accurate temperature of the workpiece 71 may include various processes on the basis of the obtained temperature information Temp1, Temp2, and Temp3, including processes other than the processes described above.

A process of performing a semiconductor manufacturing process will be described below by using the process apparatus (e.g. one of process apparatuses 100A-F) according to various embodiments described in the disclosure.

First, the plurality of workpieces 71 and 72 may be provided on the supporter 50 of the process apparatus (e.g. one of process apparatuses 100A-F). In Step1, the plurality of workpieces 71 and 72 may be heated by the plurality of the heating lamp 23. In Step2, temperatures of the plurality of workpieces 71 and 72 may be measured by using the thermo-sensor 35 of the temperature sensor 30. In Step3, the measured temperature information Temp1 may be provided to the controller 60. In Step4, the controller 60 may analyze the temperature information Temp1 to generate the heating command Heat for controlling the plurality of the heating lamp 23. In Step5, the plurality of the heating lamp 23 may be independently controlled based on the heating command Heat in real time. When a process ends, the plurality of workpieces 71 and 72 may be unloaded to the outside of the process apparatus (e.g. one of process apparatuses 100A-F).

The process apparatus according to the embodiments of the disclosure may receive light having a wavelength of 5 μm or more to measure a temperature of a workpiece.

The process apparatus according to the embodiments of the disclosure may include a plurality of noncontact thermo-sensors and a plurality of heating lamps disposed to be vertical to a top surface of the workpiece, and thus, may measure in real time an accurate temperature of the workpiece for a short time and may heat the workpiece.

Hereinabove, embodiments of the disclosure have been described with reference to the accompanying drawings, but it may be understood that those skilled in the art may implement the embodiments in other detailed forms. It should be understood that the embodiments described above are merely examples in all aspects and are not limited.

What is claimed is:

1. A method of manufacturing a semiconductor device, the method comprising:
    loading a workpiece onto a supporter disposed at a lower portion of a chamber;
    irradiating a first light of a first range of wavelength onto the workpiece by using a plurality of heating lamps of a heating module disposed at an upper portion of the chamber to heat the workpiece; and
    receiving a second light of a second range of wavelength irradiated from the workpiece by using at least one temperature sensor of the heating module;
    measuring, by an additional temperature sensor, a temperature of one from among a blocking plate, the workpiece, and the supporter, wherein the additional temperature sensor is in contact with the one from among the blocking plate, the workpiece, and the supporter;
    receiving first temperature information from the at least one temperature sensor and second temperature information from the additional temperature sensor to provide a heat command to the plurality of heating lamps; and
    estimating a temperature of the workpiece by comparing the first temperature information with the second temperature information,
    wherein the first light irradiated from each of the plurality of heating lamps onto the workpiece passes through the blocking plate, and
    wherein the second light irradiated from the workpiece and received by the at least one temperature sensor is transferred to the at least one temperature sensor without passing through the blocking plate.

2. The method of claim 1, wherein a temperature sensor of the at least one temperature sensor comprises a light path, a filter in the light path, and a thermo-sensor in the light path.

3. The method of claim 2, wherein the filter is configured to block light having a wavelength of less than 5 μm.

4. The method of claim 2, wherein the filter comprises germanium (Ge).

5. The method of claim 2, wherein
    the temperature sensor further comprises a blocking block spatially separating a process space from the filter, the process space provided between the heating module and the supporter, and
    the blocking block comprises a material differing from a material of the blocking plate.

6. The method of claim 5, wherein the blocking block transmits light having a wavelength of 5 μm or more.

7. The method of claim 5, wherein the blocking block comprises zinc selenide (ZnSe).

8. The method of claim 1, wherein the plurality of heating lamps and the at least one temperature sensor are disposed to be vertical to a top surface of the supporter.

9. The method of claim 1, wherein the blocking plate comprises quartz.

10. The method of claim 1, wherein the supporter comprises a supporting plate, and a heater and a cooler each embedded into the supporting plate.

11. The method of claim 1, wherein a power of each of the plurality of heating lamps is independently adjusted.

12. The method of claim 1, wherein,
    in a top view, the heating module is divided into a plurality of areas, and
    powers of the plurality of heating lamps respectively disposed in the divided plurality of areas are simultaneously adjusted in common.

13. The method of claim 12, wherein the at least one temperature sensor is a plurality of temperature sensors, and the plurality of temperature sensors are selectively disposed in some of the plurality of areas.

14. The method of claim 1, wherein
    the heating module comprises a light path, a filter in the light path, and a thermo-sensor in the light path, and
    the filter is configured to transmit light having a wavelength of 5 μm or more.

15. The method of claim 1, wherein the measuring comprises measuring, by the additional temperature sensor, the temperature of the blocking plate, wherein the additional temperature sensor is in contact with the blocking plate.

16. The method of claim 1, wherein the measuring comprises measuring, by the additional temperature sensor, the temperature of the workpiece, wherein the additional temperature sensor is in contact with the workpiece.

17. The method of claim 1, wherein the measuring comprises measuring, by the additional temperature sensor, the temperature of the supporter, wherein the additional temperature sensor is in contact with the supporter.

* * * * *